(12) United States Patent
Inokuma (10) Patent No.: US 7,947,554 B2
(45) Date of Patent: May 24, 2011

(54) METHOD OF FABRICATING SEMICONDUCTOR DEVICE HAVING SEMICONDUCTOR ELEMENTS

(75) Inventor: Hideki Inokuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 651 days.

(21) Appl. No.: 11/905,302

(22) Filed: Sep. 28, 2007

(65) Prior Publication Data

US 2008/0079097 A1   Apr. 3, 2008

(30) Foreign Application Priority Data

Sep. 29, 2006   (JP) .................. 2006-269333

(51) Int. Cl.
*H01L 21/8242*   (2006.01)
*H01L 21/20*   (2006.01)

(52) U.S. Cl. .................. 438/253; 438/396

(58) Field of Classification Search .......... 438/253–256, 438/393–399, E27.086
See application file for complete search history.

(56) References Cited

U.S. PATENT DOCUMENTS

| 6,573,172 B1 | 6/2003 | En et al. |
| 2007/0122966 A1 * | 5/2007 | Hoentschel et al. .......... 438/231 |

FOREIGN PATENT DOCUMENTS

| JP | 2003-273240 | 9/2003 |
| JP | 2004-274022 | 9/2004 |
| JP | 2006-173432 | 6/2006 |

OTHER PUBLICATIONS

A Notification of Reasons For Rejection mailed by the Japanese Patent Office on Feb. 17, 2009, for Japanese Patent Application No. 2006-269333, and English language translation thereof.
Chen et al.; "Stress Proximity Technique for Performance Improvement With Dual Stress Liner at 45nm Technology and Beyond"; 2006 Symposium on VLSI Technology Digest of Technical Papers, pp. 74-75, (2006).

\* cited by examiner

*Primary Examiner* — Cuong Q Nguyen
(74) *Attorney, Agent, or Firm* — Finnegan, Henderson, Farabow, Garrett & Dunner, L.L.P.

(57) ABSTRACT

According to an aspect of the invention, there is provided a semiconductor device including a first semiconductor element formed on a semiconductor substrate and using electrons as carriers, and a second semiconductor element formed on the semiconductor substrate and using holes as carriers, a first insulating film and a second insulating film formed on source/drain regions and gate electrodes of the first element and the second element, the first insulating film having tensile stress with respect to the first element, and the second insulating film having compression stress with respect to the second element, and sidewall spacers of the gate electrodes of the first element and the second element, at least portions of the sidewall spacers being removed, wherein at least one of the first insulating film and the second insulating film does not close a spacing between the gate electrodes of the first element and the second element.

7 Claims, 14 Drawing Sheets

Film thickness that does not close narrow gate electrode space

METHOD OF FABRICATING SEMICONDUCTOR DEVICE HAVING SEMICONDUCTOR ELEMENTS

CROSS-REFERENCE TO RELATED APPLICATIONS

This application is based upon and claims the benefit of priority from prior Japanese Patent Application No. 2006-269333, filed Sep. 29, 2006, the entire contents of which are incorporated herein by reference.

BACKGROUND OF THE INVENTION

1. Field of the Invention

The present invention relates to a semiconductor device and a method of fabricating the same.

2. Description of the Related Art

To increase the driving current of a transistor in a semiconductor device, it is desirable to use a material having high stress as an insulating film covering source/drain regions and gate electrodes, and deposit this insulating film as a thicker layer.

If a narrow spacing between the gate electrodes is closed by increasing the thickness of this insulating film, however, it becomes difficult to maintain films formed as sidewall spacers of the gate electrodes, since the thickness of the gate electrode film is added to an effective film thickness to be removed when forming different insulating films in nMOS and pMOS transistors. In addition, if films formed as stoppers of the sidewall spacer films are also removed, etching damage enters source/drain extension regions as well, and this degrades the junction leakage characteristic.

If a thin film that does not close the narrow spacing between the gate electrodes is formed as the insulating film in order to avoid the above problem, insufficient stress is applied to the channel portion of the transistor, so the desired driving current cannot be obtained.

Note that Jpn. Pat. Appln. KOKAI Publication No. 2003-273240 describes steps of forming insulating films having different stresses in an nMOSFET and pMOSFET.

BRIEF SUMMARY OF THE INVENTION

According to an aspect of the invention, there is provided a semiconductor device comprising: a first semiconductor element formed on a semiconductor substrate and using electrons as carriers, and a second semiconductor element formed on the semiconductor substrate and using holes as carriers; a first insulating film and a second insulating film formed on source/drain regions and gate electrodes of the first semiconductor element and the second semiconductor element, the first insulating film having tensile stress with respect to the first semiconductor element, and the second insulating film having compression stress with respect to the second semiconductor element; and sidewall spacers of the gate electrodes of the first semiconductor element and the second semiconductor element, at least portions of the sidewall spacers being removed, wherein at least one of the first insulating film and the second insulating film does not close a spacing between the gate electrodes of the first semiconductor element and the second semiconductor element.

According to another aspect of the invention, there is provided a semiconductor device fabrication method comprising: forming, on a semiconductor substrate, a first semiconductor element using electrons as carriers, and a second semiconductor element using holes as carriers; forming sidewall spacers of gate electrodes of the first semiconductor element and the second semiconductor element; removing at least portions of the sidewall spacers of the gate electrodes of the first semiconductor element and the second semiconductor element; depositing a first insulating film having one of tensile stress and compression stress on source/drain regions and the gate electrodes of the first semiconductor element and the second semiconductor element, the first insulating film not closing a spacing between the gate electrodes of the first semiconductor element and the second semiconductor element; depositing a second insulating film on the first insulating film; removing the first insulating and the second insulating film deposited on one of the first semiconductor element and the second semiconductor element; depositing a third insulating film having the other one of tensile stress and compression stress on the source/drain regions and the gate electrodes of the first semiconductor element and the second semiconductor element; and removing the third insulating film deposited on the other one of the first semiconductor element and the second semiconductor element.

DETAILED DESCRIPTION OF THE INVENTION

Embodiments will be explained below with reference to the accompanying drawing.

In a semiconductor device comprising an active element such as a MOSFET, the current drivability improves when a film having tensile stress and a film having compression stress are respectively used in a transistor (nMOS) in which electrons are carriers and a transistor (pMOS) in which holes are carriers, as an insulating film covering source/drain regions and gate electrodes. The embodiments avoid the above-mentioned problems arising when forming different insulating films in nMOS and pMOS transistors in order to improve the current drivability of both the nMOS and pMOS transistors.

FIGS. 1 to 10 are sectional views showing semiconductor device fabrication steps according to the first embodiment. The semiconductor device fabrication steps according to the first embodiment will be explained below with reference to FIGS. 1 to 10.

Figure 1:
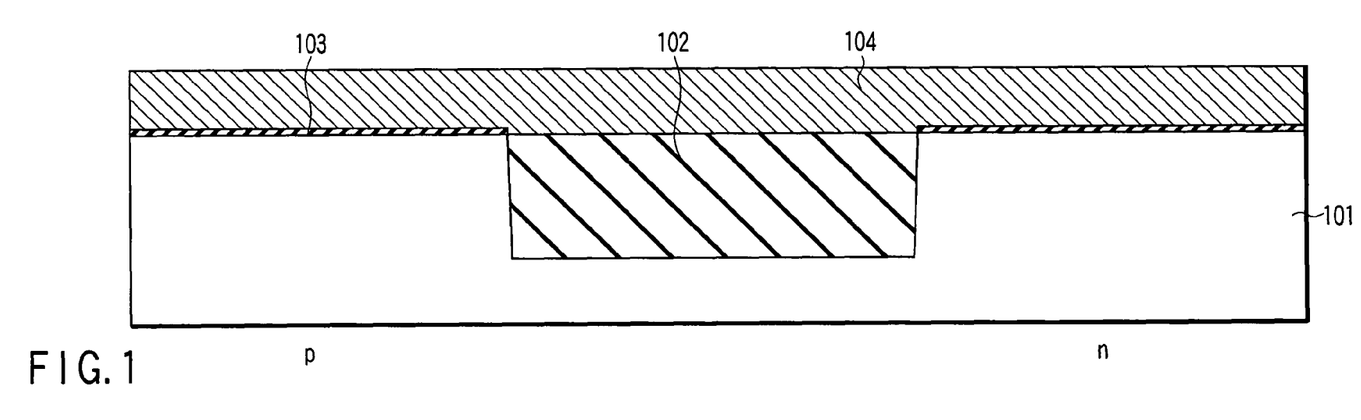
FIG. 1 is a sectional view showing a semiconductor device fabrication step according to the first embodiment.

First, as shown in FIG. 1, an element isolation region 102 is formed in an Si substrate (bulk Si substrate, SiGe substrate, or SOI substrate) by burying an insulating film in a trench about 300 nm deep, and an impurity serving as a well and channel is doped. After that, a gate insulating film 103 about 1 nm thick is deposited on the Si substrate 101, and a gate electrode film 104 about 100 nm thick is deposited on the entire surface.

Figure 2:
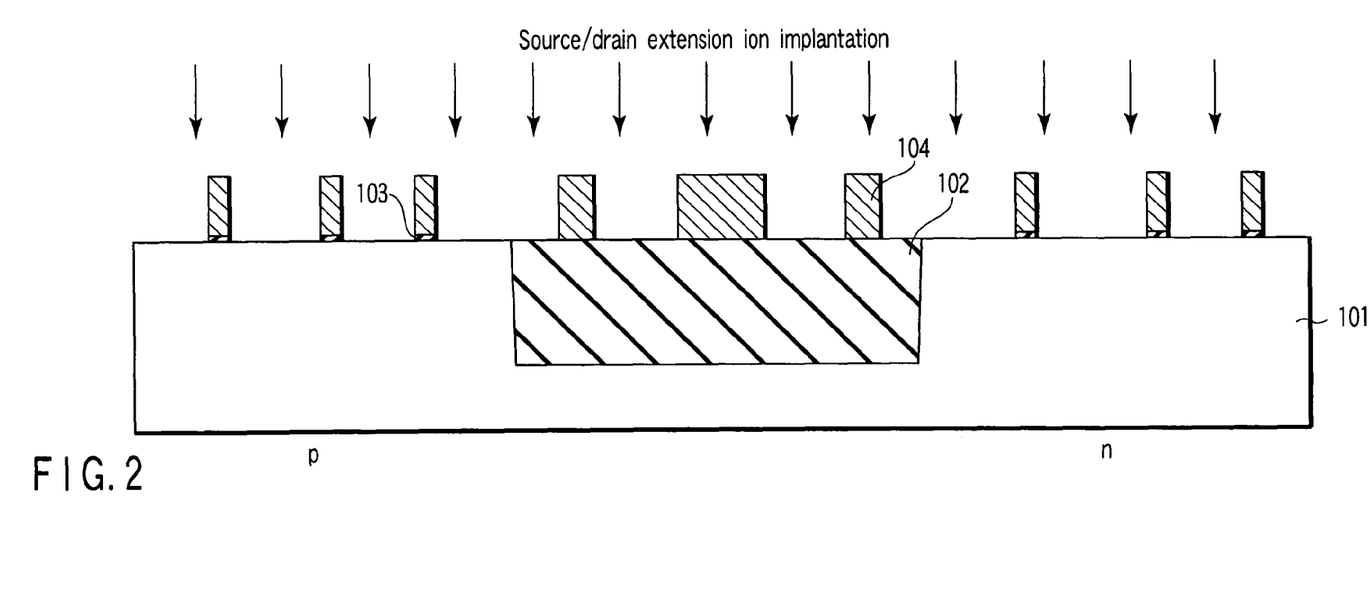
FIG. 2 is a sectional view showing a semiconductor device fabrication step according to the first embodiment.

Then, as shown in FIG. 2, the gate insulating film 103 is used as a stopper to process the gate electrode film 104 by lithography and dry etching, and an impurity serving as source/drain extensions is doped by ion implantation.

Figure 3:
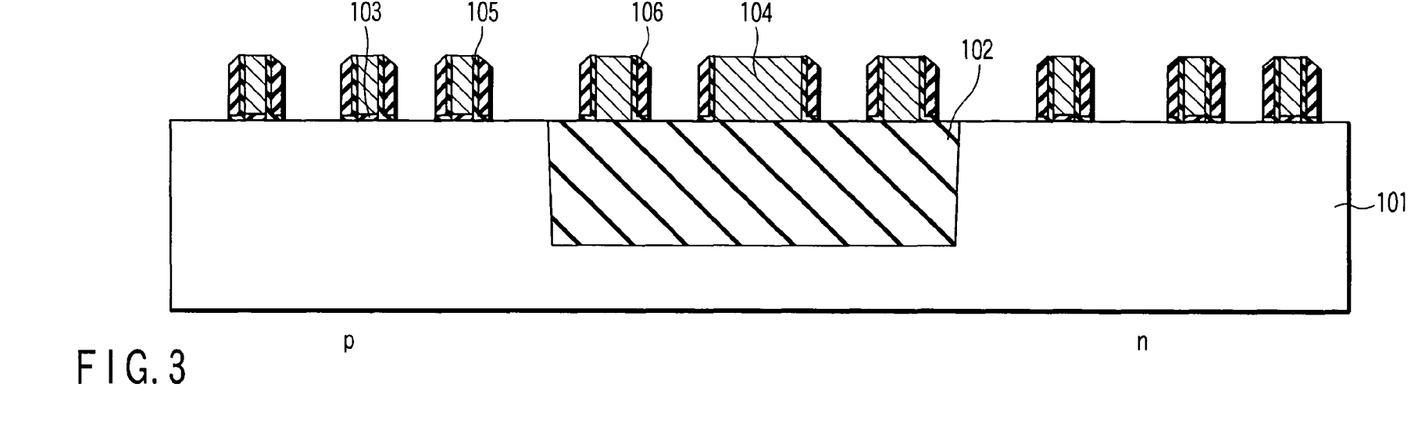
FIG. 3 is a sectional view showing a semiconductor device fabrication step according to the first embodiment.

In addition, to ensure the transistor characteristics and reliability, sidewall spacers are formed to separate a source and drain by about 30 nm. To avoid etching damage from entering the Si substrate 101 during this sidewall spacer processing, as shown in FIG. 3, it is possible to form thin L-shaped first $SiO_2$ films 105 on the gate electrode film 104, deposit first SiN films 106 whose film thickness is adjusted to obtain a desired sidewall width, process the first SiN films 106 by using the first $SiO_2$ films 105 as stoppers, and remove the remaining first $SiO_2$ films 105.

Figure 4:
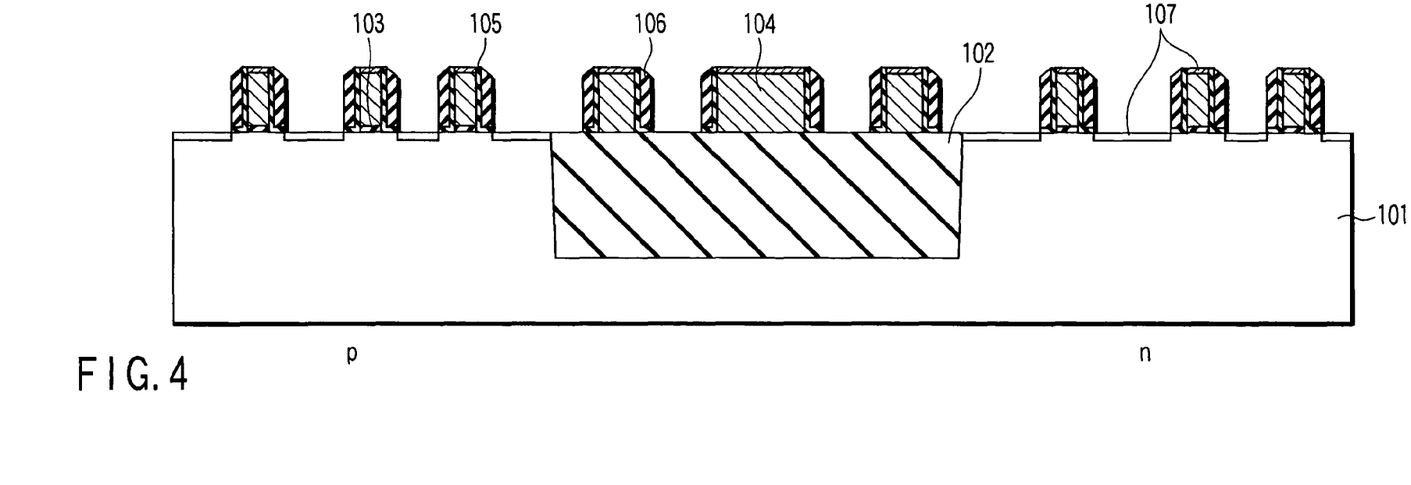
FIG. 4 is a sectional view showing a semiconductor device fabrication step according to the first embodiment.

After the sidewall spacers are processed, as shown in FIG. 4, an impurity serving as a source and drain are doped and activated, and a metal 107 such as Ti, Co, or Ni is deposited and alloyed in order to decrease the interconnection resistance of source/drain regions and gate electrodes.

After this alloying, a barrier film serving as an etching stopper in later contact formation is deposited. When a film having tensile stress and a film having compression stress are respectively used as the barrier films in a transistor (nMOS) in which electrons are carriers and a transistor (pMOS) in which holes are carriers, the current drivability of both transistors can increase.

Figure 5:
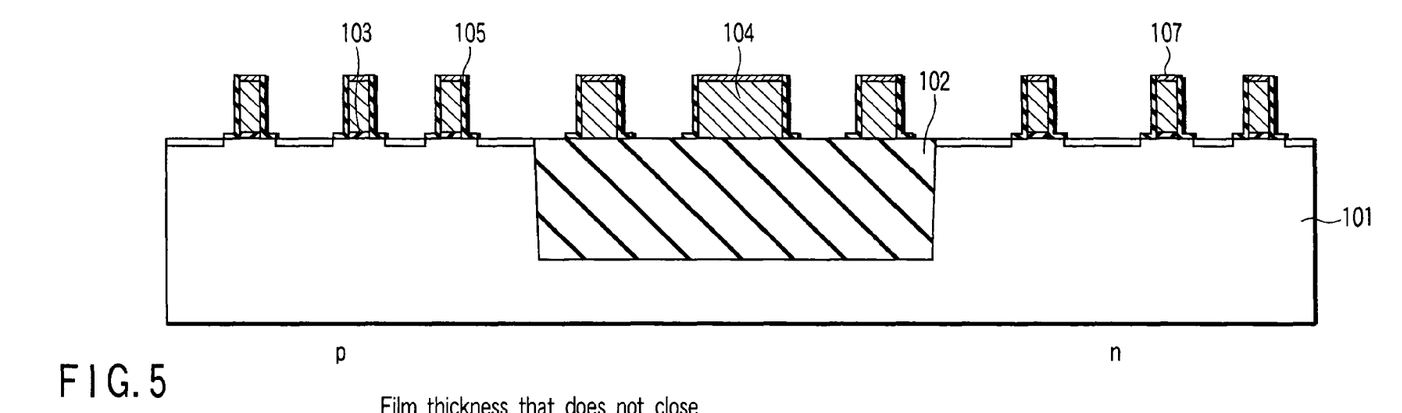
FIG. 5 is a sectional view showing a semiconductor device fabrication step according to the first embodiment.

In this state, as shown in FIG. 5, the first SiN films 106 processed as sidewall spacers are entirely or partially removed by wet or dry etching.

Figure 6:
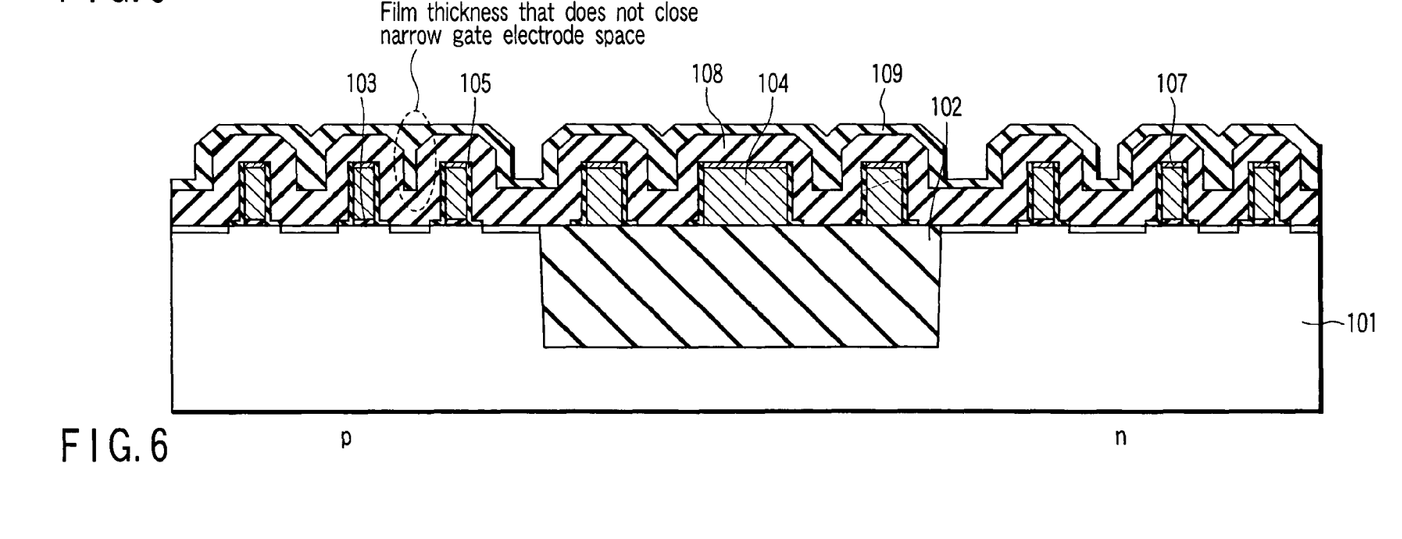
FIG. 6 is a sectional view showing a semiconductor device fabrication step according to the first embodiment.
Figure 7:
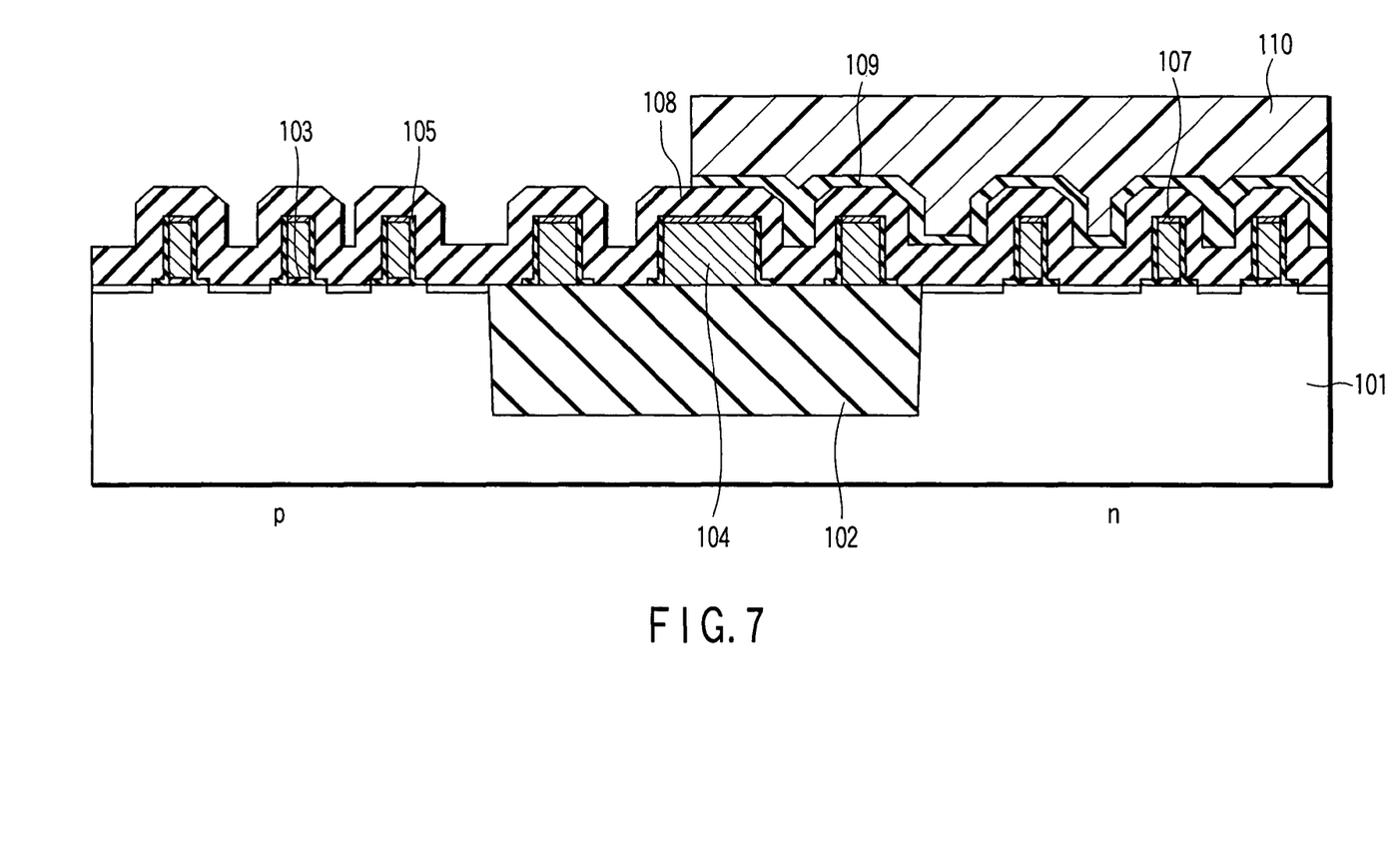
FIG. 7 is a sectional view showing a semiconductor device fabrication step according to the first embodiment.

After that, as shown in FIG. 6, a second SiN film 108 having tensile stress is deposited to have a film thickness that does not close a narrow spacing between the gate electrodes (letting W be this film thickness, 2×(W+thickness X of stopper film [$SiO_2$ film 105])<space Y between gate electrodes [GC]), and a second $SiO_2$ film 109 about 20 nm thick is deposited. Subsequently, as shown in FIG. 7, a first resist 110 is deposited and patterned to expose only the pMOS region by lithography.

After the pMOS region is exposed by lithography, the first resist 110 is used as a mask to remove the second $SiO_2$ film 109.

Figure 8:
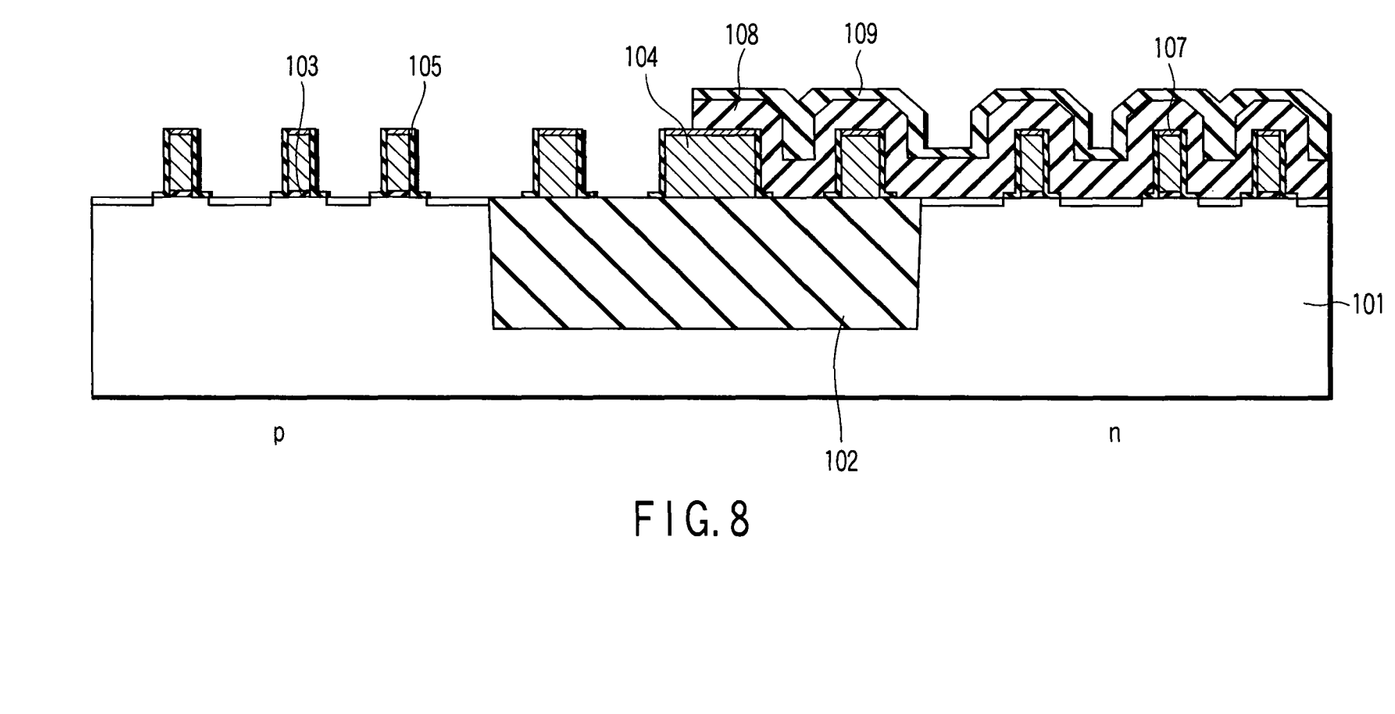
FIG. 8 is a sectional view showing a semiconductor device fabrication step according to the first embodiment.

In addition, as shown in FIG. 8, after the first resist 110 is removed, the second SiN film 108 is partially or entirely removed while maintaining the second $SiO_2$ film 109 in the nMOS region and the first $SiO_2$ films 105 as stoppers in the pMOS region.

Figure 9:
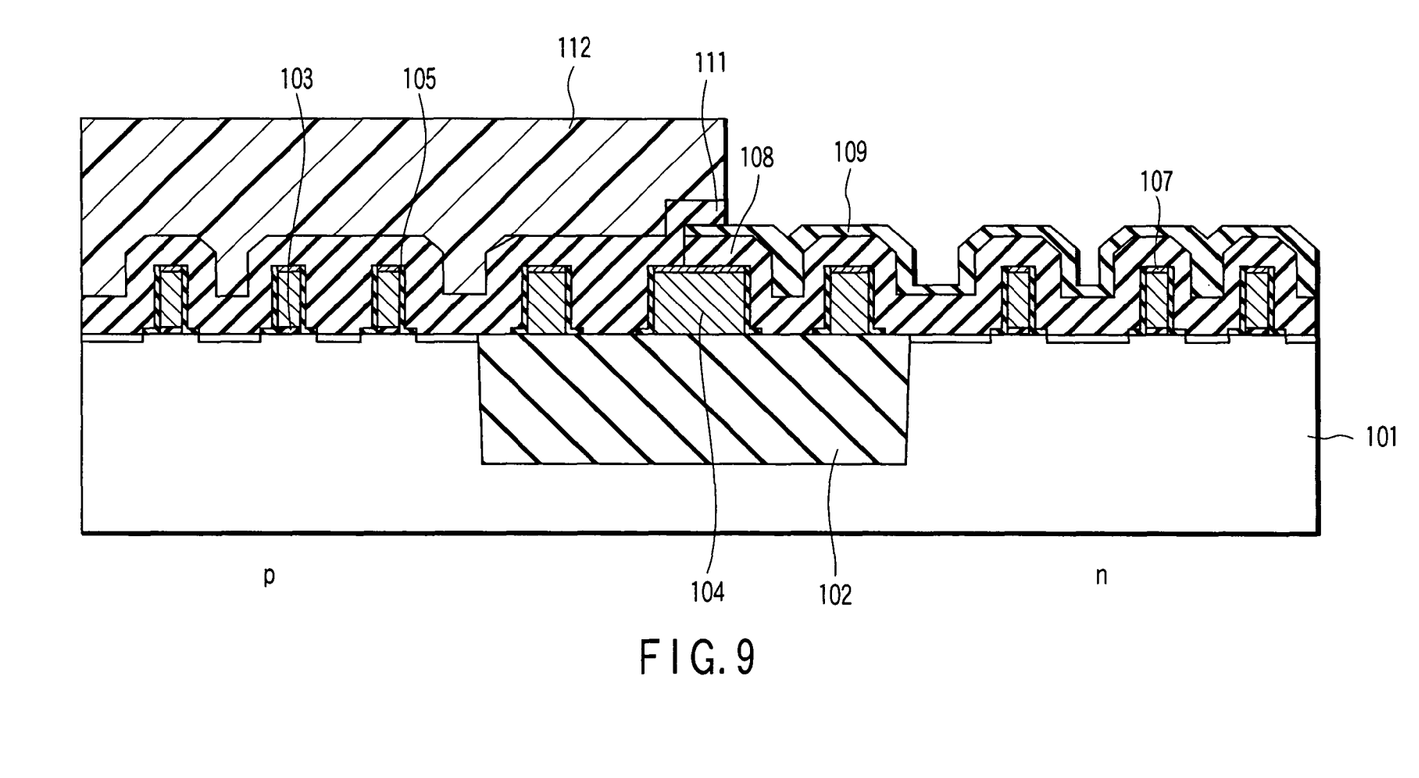
FIG. 9 is a sectional view showing a semiconductor device fabrication step according to the first embodiment.

As shown in FIG. 9, after a third SiN film 111 having compression stress is formed, a second resist 112 is deposited and patterned to expose only the nMOS region by lithography, and the third SiN film 111 on the nMOS is removed by using the second $SiO_2$ film 109 as a stopper.

Figure 10:
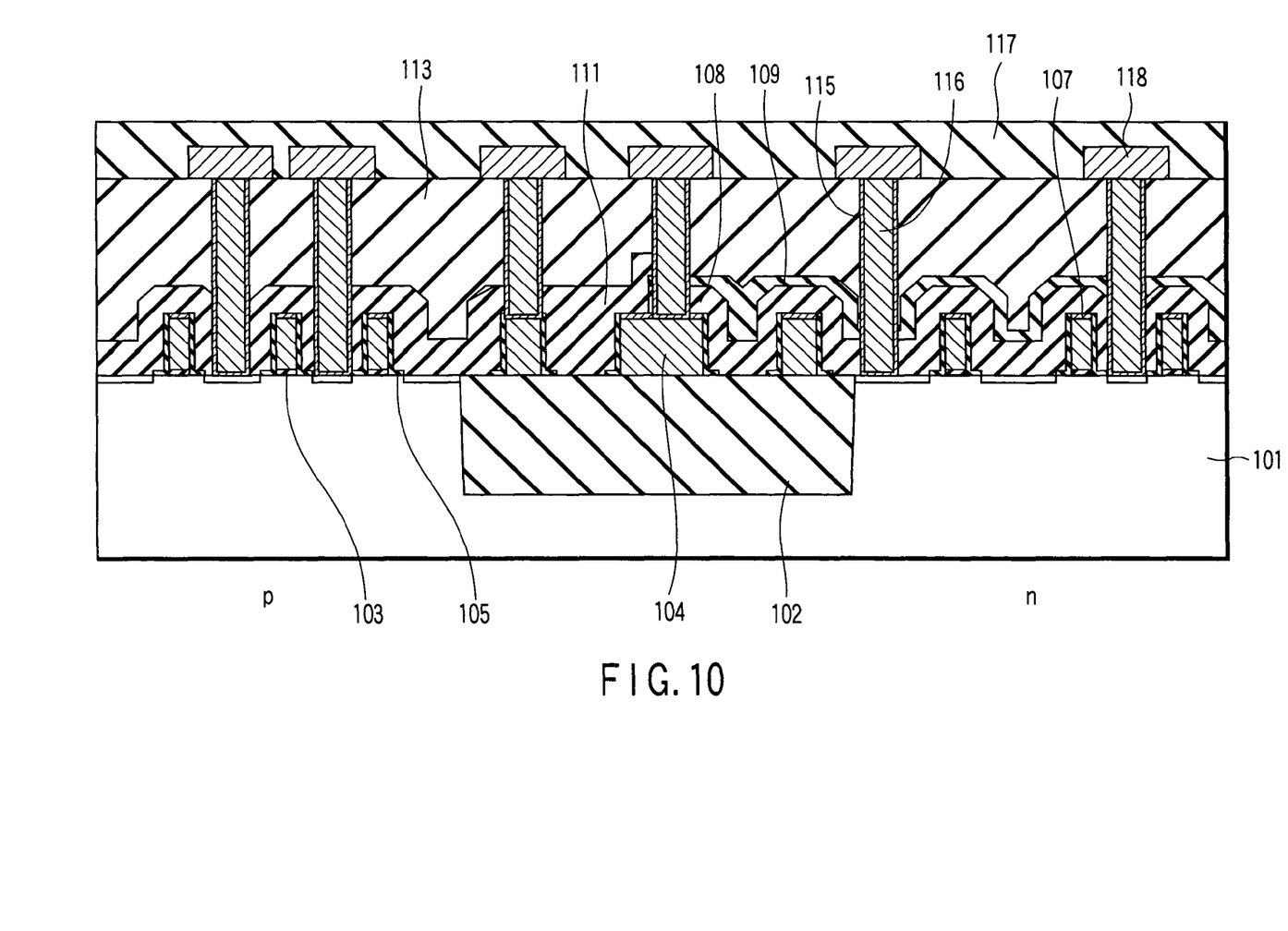
FIG. 10 is a sectional view showing a semiconductor device fabrication step according to the first embodiment.

After that, as shown in FIG. 10, the second resist 112 is removed, a third $SiO_2$ film 113 is deposited and planarized by CMP, and a semiconductor device is completed by forming contact holes, an interlayer dielectric film 117, and a metal interconnection 118.

Note that each of the second SiN film 108 having tensile stress and the third SiN film 111 having compression stress is made of a silicon oxide film, silicon nitride film, silicon oxynitride film, hafnium oxide film, aluminum oxide film, aluminum nitride film, tantalum oxide film, or titanium oxide film. When the film thickness is 10 to 200 nm, the film has sufficient stress to increase the driving current of the transistor.

Figure 11:
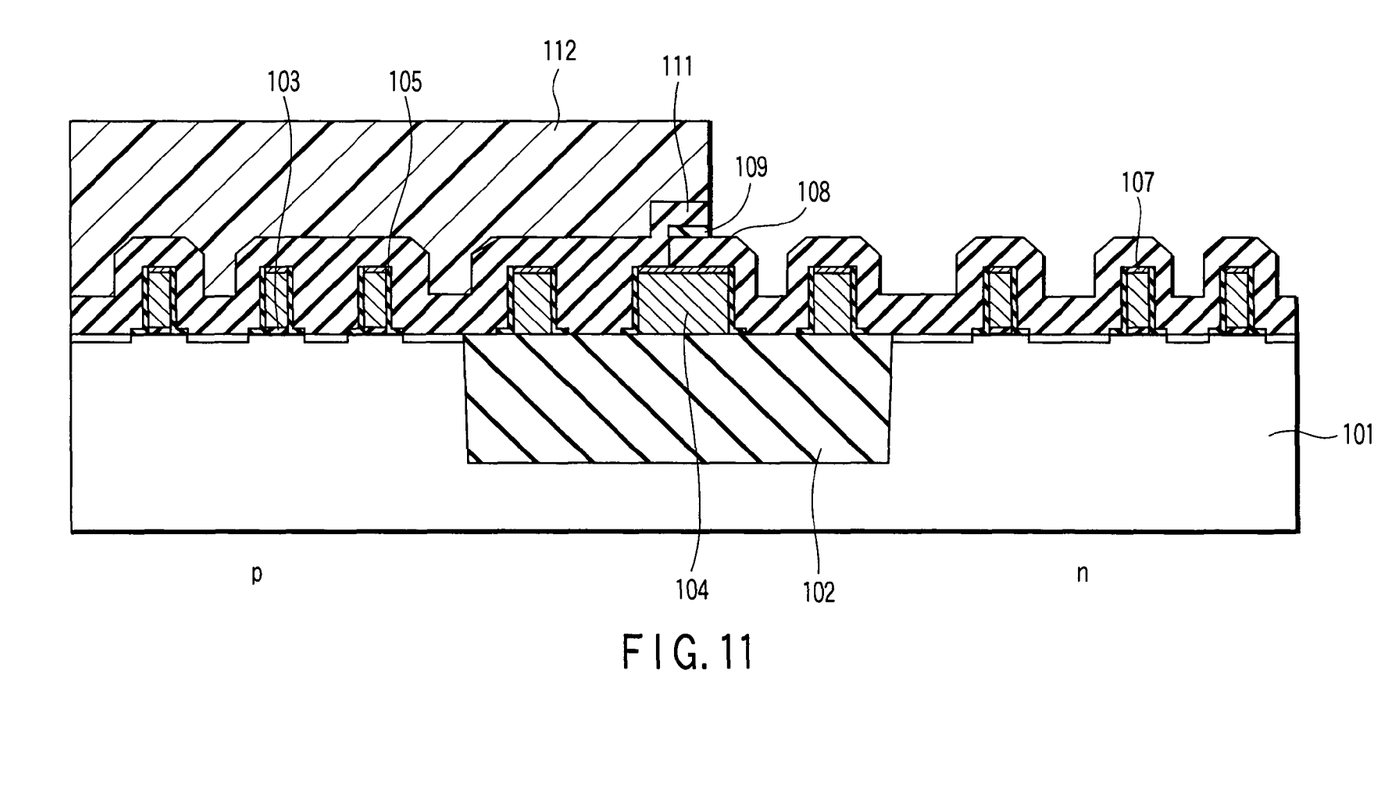
FIG. 11 is a sectional view showing a semiconductor device fabrication step according to the second embodiment.
Figure 12:
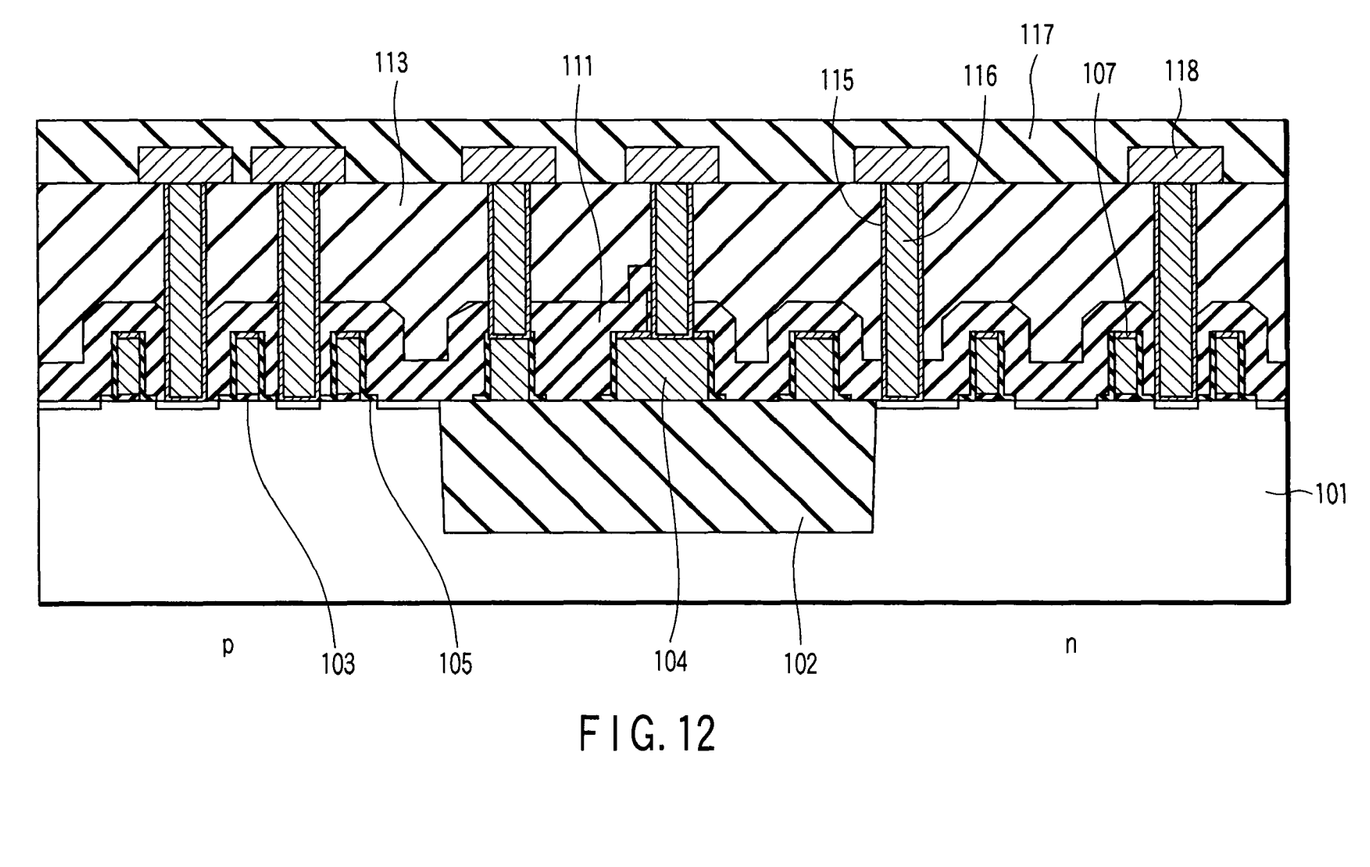
FIG. 12 is a sectional view showing a semiconductor device fabrication step according to the second embodiment.

FIGS. 11 and 12 are sectional views showing semiconductor device fabrication steps according to the second embodiment. The semiconductor device fabrication steps of the second embodiment will be explained below with reference to FIGS. 11 and 12.

First, steps up to FIG. 9 are performed in the same manner as in the first embodiment. That is, an alloy layer 107 is formed on source/drain regions and gate electrodes, first SiN films 106 processed as sidewall spacers are removed, a second SiN film 108 and second $SiO_2$ film 109 are deposited, the second SiN film 108 and second $SiO_2$ film 109 in a pMOS region are removed by lithography and dry etching, a third SiN film 111 and second resist 112 are deposited, and the third SiN film 111 deposited in an nMOS region is removed by using the second resist 112.

In addition, as shown in FIG. 11, the second $SiO_2$ film 109 is removed by using the second resist 112 as a mask and the second SiN film 108 as a stopper.

After that, as shown in FIG. 12, the second resist 112 is removed, a third $SiO_2$ film 113 is deposited and planarized by CMP, and a semiconductor device is completed by forming contact holes, an interlayer dielectric film 117, and a metal interconnection 118.

FIGS. 13 to 18 are sectional views showing semiconductor device fabrication steps according to the third embodiment. The semiconductor device fabrication steps of the third embodiment will be explained below with reference to FIGS. 13 to 18.

Figure 13:
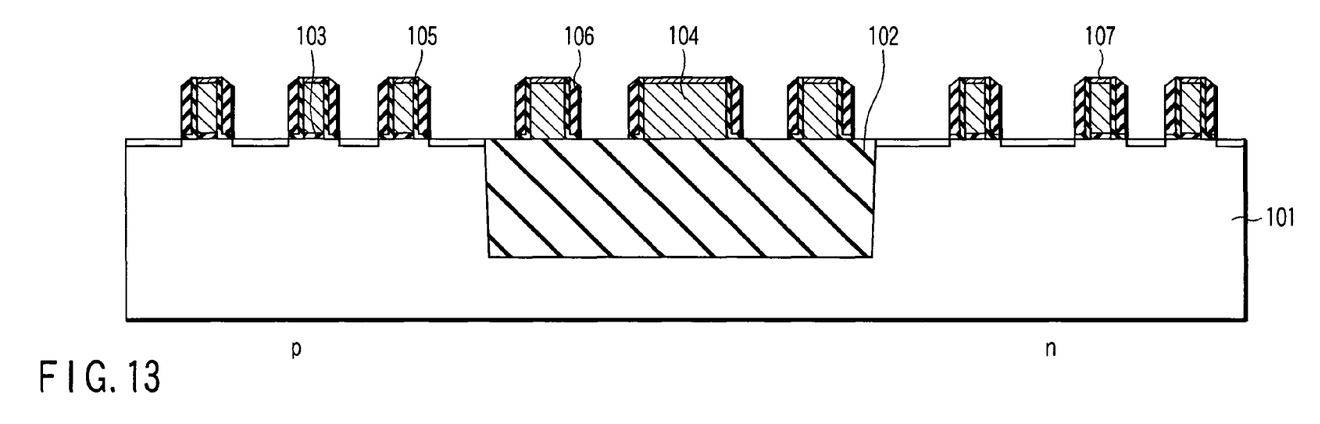
FIG. 13 is a sectional view showing a semiconductor device fabrication step according to the third embodiment.

First, the steps shown in FIGS. 1 to 3 are performed to form an alloy layer on source/drain regions and gate electrodes as shown in FIG. 13.

Figure 14:
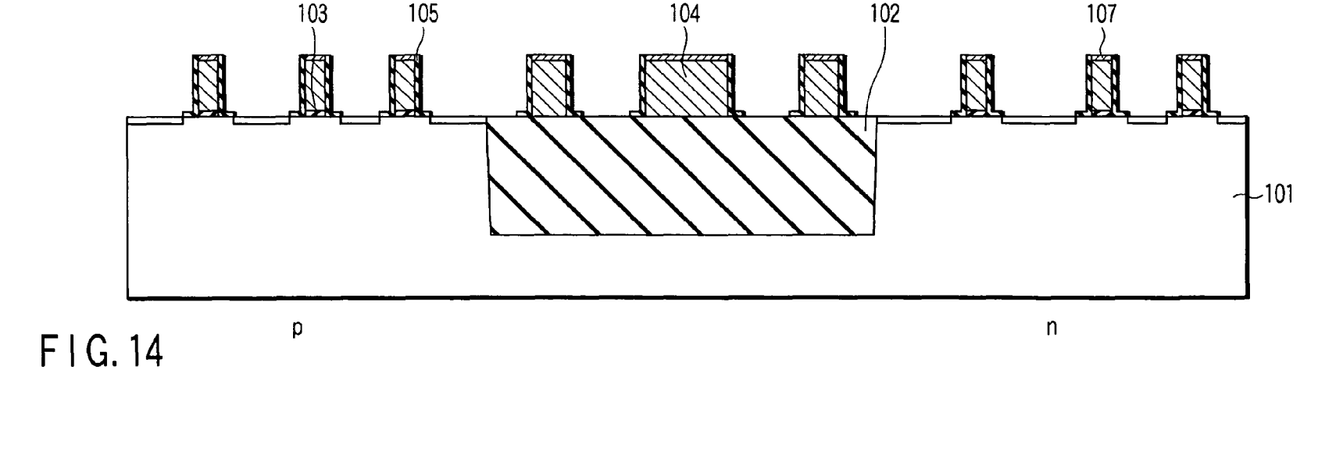
FIG. 14 is a sectional view showing a semiconductor device fabrication step according to the third embodiment.

In this state, as shown in FIG. 14, first SiN films 106 processed as sidewall spacers are removed by wet or dry etching.

Figure 15:
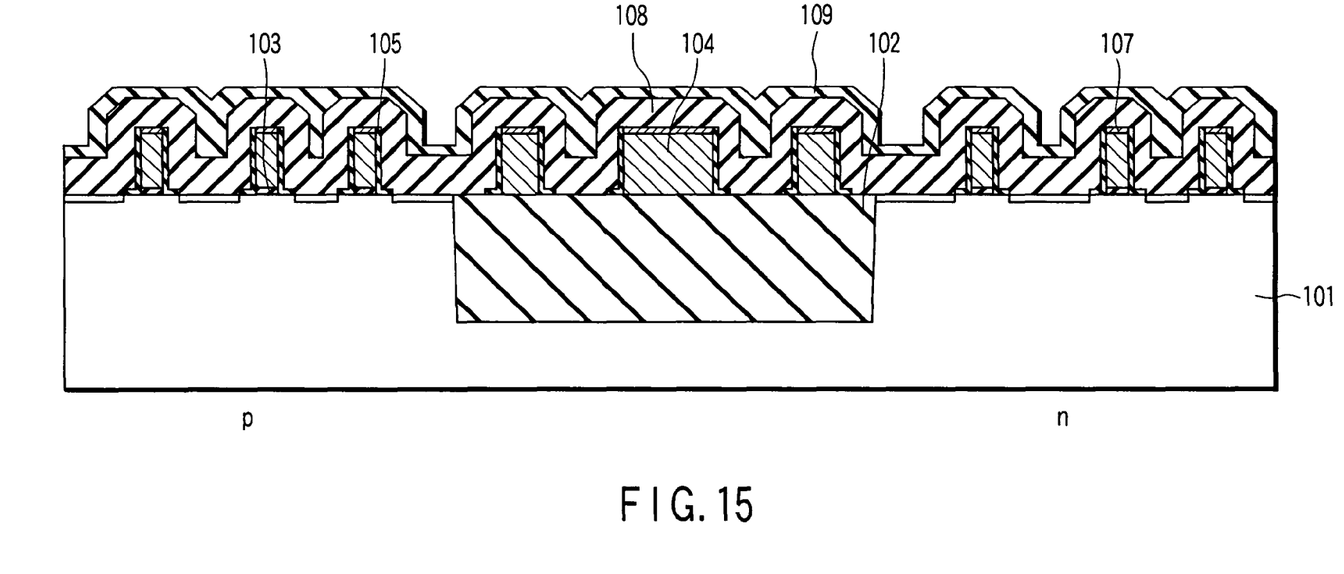
FIG. 15 is a sectional view showing a semiconductor device fabrication step according to the third embodiment.
Figure 16:
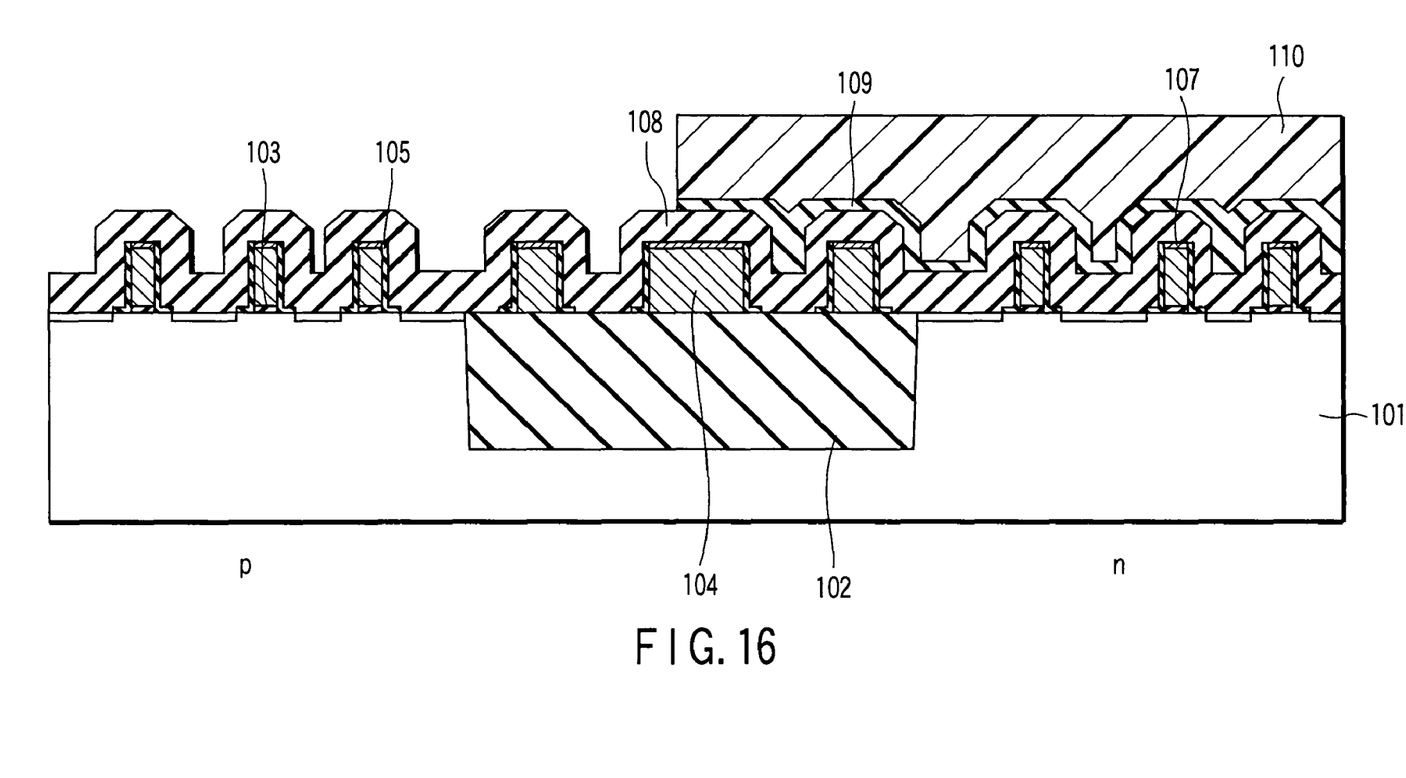
FIG. 16 is a sectional view showing a semiconductor device fabrication step according to the third embodiment.

After that, as shown in FIG. 15, a second SiN film 108 having tensile stress is deposited to have a film thickness that does not close a narrow spacing between the gate electrodes, and a second $SiO_2$ film 109 about 20 nm is deposited. Subsequently, as shown in FIG. 16, a first resist 110 is deposited and patterned to expose only a pMOS region by lithography.

As in the first embodiment, after the pMOS region is exposed by lithography, the second $SiO_2$ film 109 is removed by using the first resist 110 as a mask.

Figure 17:
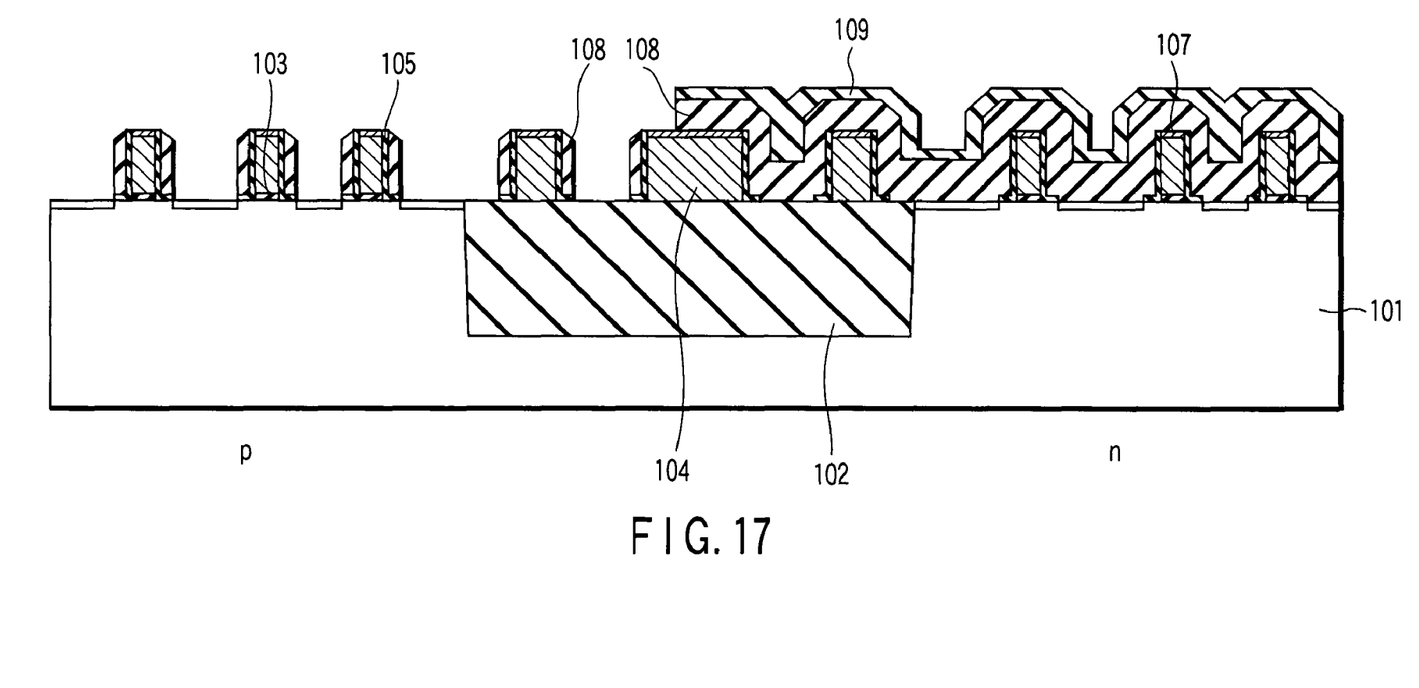
FIG. 17 is a sectional view showing a semiconductor device fabrication step according to the third embodiment.

Furthermore, as shown in FIG. 17, after the first resist 110 is removed, the second SiN film 108 in the pMOS region is partially removed and processed into sidewall spacers of the gate electrodes while maintaining the second SiO$_2$ film 109 in an nMOS region and first SiO$_2$ films 105 as stoppers in the pMOS region.

Figure 18:
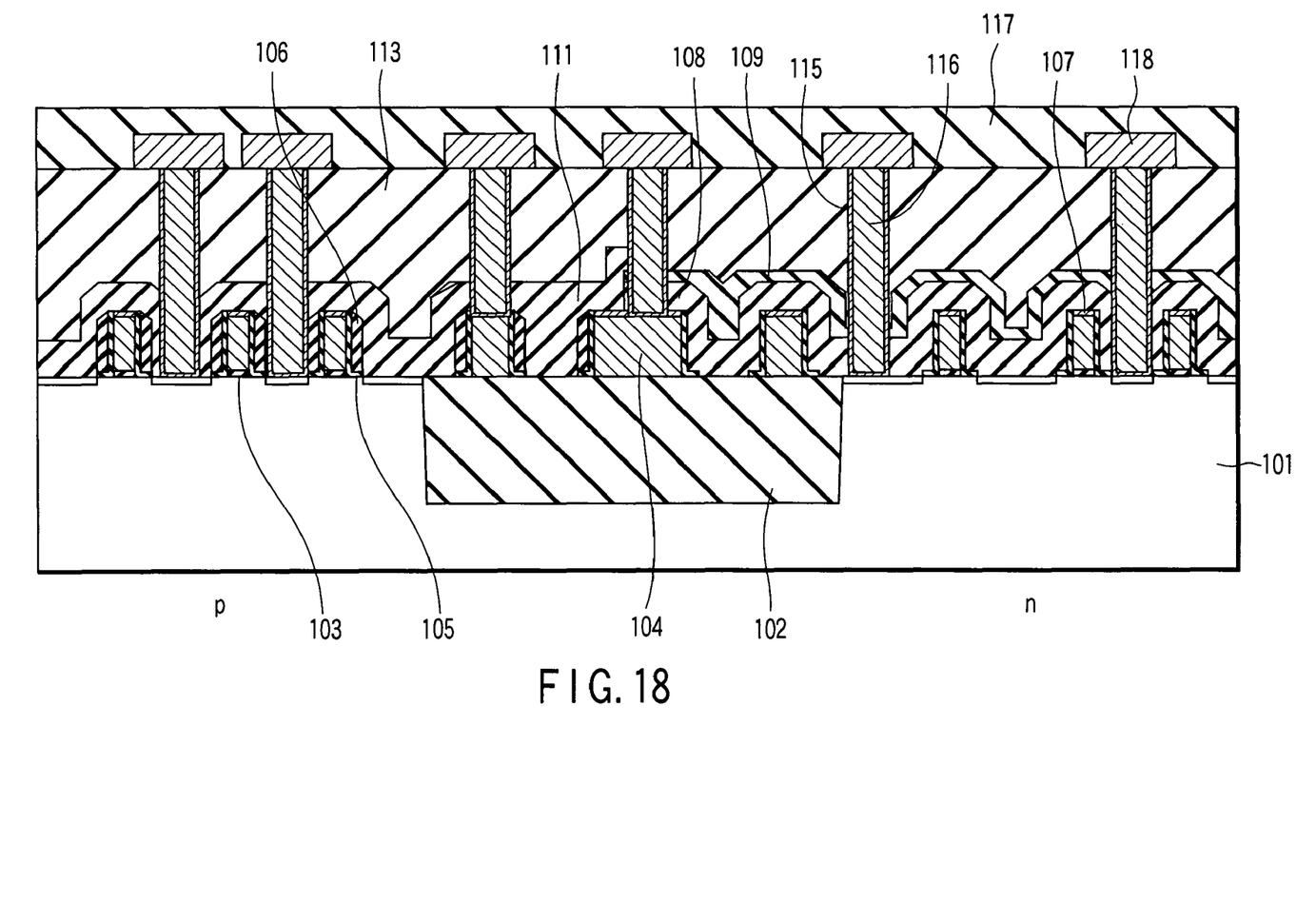
FIG. 18 is a sectional view showing a semiconductor device fabrication step according to the third embodiment.

After that, as shown in FIG. 18, a third SiN film 111 having compression stress is formed and processed. Finally, a third SiO$_2$ film 113 is deposited and planarized by CMP, and a semiconductor device is completed by forming contact holes, an interlayer dielectric film 117, and a metal interconnection 118.

In the first to third embodiments described above, partially or entirely removing the sidewall spacers make it possible to avoid the insulating film covering the alloy layer formed on the source/drain regions and gate electrodes from closing the narrow spacing between the gate electrodes while maintaining the film thickness of the insulating film. Also, the insulating film can be readily removed because it is formed so as not to close the narrow spacing between the gate electrodes. This makes the formation of nMOS and PMOS transistors having improved current drivability feasible. Accordingly, the initially deposited insulating film can be removed without causing etching damage to extension portions. This facilitates the formation of different insulating films having different stresses in the nMOS and pMOS transistors. Furthermore, since the insulating film having stress is formed close to the channel portion of the transistor, the stress efficiently acts on the transistor, so the current drivability of the transistor can further improve. Accordingly, the stress can be increased not only by partially or entirely removing the sidewall spacers, but also by preventing the insulating film from closing the narrow spacing between the gate electrodes.

The embodiments can provide a semiconductor device capable of applying sufficient stress to the channel portion of a transistor, and a method of fabricating the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device fabrication method comprising:
    forming, on a semiconductor substrate, a plurality of first semiconductor elements using electrons as carriers side by side, and a plurality of second semiconductor elements using holes as carriers side by side;
    forming sidewall spacers of gate electrodes of the first semiconductor elements and the second semiconductor elements;
    removing at least surface portions of the sidewall spacers of the gate electrodes of the first semiconductor elements and the second semiconductor elements;
    depositing a first insulating film having one of tensile stress and compression stress on source/drain regions and the gate electrodes of the first semiconductor elements and the second semiconductor elements, the first insulating film not closing a spacing between the gate electrodes of the first semiconductor elements and a spacing between the second semiconductor elements;
    depositing a second insulating film on the first insulating film;
    removing the first insulating and the second insulating film deposited on one of the first semiconductor elements and the second semiconductor elements;
    depositing a third insulating film having the other one of tensile stress and compression stress on the source/drain regions and the gate electrodes of the first semiconductor elements and the second semiconductor elements; and
    removing the third insulating film deposited on the other one of the first semiconductor elements and the second semiconductor elements.

2. The method according to claim 1, wherein after the third insulating film is removed, the second insulating film existing on the first insulating film is removed.

3. The method according to claim 1, wherein when removing the first insulating film after the removal of the second insulating film, the first insulating film in a region where the second insulating film does not exist is processed into secondary sidewall spacers of the gate electrode.

4. The method according to claim 1, wherein film thicknesses of the first insulating film and the second insulating film are 10 to 200 nm.

5. The method according to claim 1, wherein each of the first insulating film and the second insulating film is one film selected from the group consisting of a silicon oxide film, a silicon nitride film, a silicon oxynitride film, a hafnium oxide film, an aluminum oxide film, an aluminum nitride film, a tantalum oxide film, and a titanium oxide film.

6. The method according to claim 1, further comprising:
    forming L-shaped stopper films on the gate electrodes of the first semiconductor elements and the second semiconductor elements; and
    forming the sidewall spacers on the stopper films.

7. The method according to claim 6, wherein a film thickness W of one film of the first insulating film and the third insulating film, which has the tensile stress, a film thickness X of the stopper film, and a space Y between the gate electrodes satisfy an equation, $2\times(W+X)<Y$.

* * * * *